United States Patent
Kakamu

(10) Patent No.: US 6,777,323 B2
(45) Date of Patent: Aug. 17, 2004

(54) LAMINATION STRUCTURE WITH COPPER WIRING AND ITS MANUFACTURE METHOD

(75) Inventor: Katsumi Kakamu, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/287,513

(22) Filed: Nov. 5, 2002

(65) Prior Publication Data

US 2003/0176063 A1 Sep. 18, 2003

(30) Foreign Application Priority Data

Mar. 14, 2002 (JP) ........................................ 2002-070298

(51) Int. Cl.$^7$ .......................................... H01L 21/4763
(52) U.S. Cl. ...................... 438/633; 438/637; 438/643; 438/653; 438/672; 438/687; 438/795; 438/798
(58) Field of Search ................................ 438/633, 637, 438/643, 653, 672, 687, 795, 798; 257/751, 752, 758, 760, 762

(56) References Cited

U.S. PATENT DOCUMENTS

| | | | | |
|---|---|---|---|---|
| 5,861,675 A | * | 1/1999 | Sasaki et al. ............... | 257/764 |
| 5,919,531 A | * | 7/1999 | Arkles et al. ............... | 427/576 |
| 6,077,764 A | * | 6/2000 | Sugiarto et al. ............ | 438/597 |
| 6,323,121 B1 | * | 11/2001 | Liu et al. .................... | 438/633 |
| 6,458,650 B1 | * | 10/2002 | Huang et al. ............... | 438/253 |
| 6,486,082 B1 | * | 11/2002 | Cho et al. ................... | 438/789 |
| 2001/0049181 A1 | * | 12/2001 | Rathi et al. ................. | 438/471 |
| 2002/0102365 A1 | * | 8/2002 | Narasimhan et al. ....... | 427/569 |
| 2002/0187643 A1 | * | 12/2002 | Gu et al. ..................... | 438/694 |

FOREIGN PATENT DOCUMENTS

| | | | | |
|---|---|---|---|---|
| JP | 11-8235 | | 1/1999 | |
| JP | 2001-36066 | | 2/2001 | |
| JP | 2001-160590 | * | 6/2001 | ......... H01L/21/768 |

* cited by examiner

Primary Examiner—Hsien Ming Lee
(74) Attorney, Agent, or Firm—Armstrong, Kratz, Quintos, Hanson & Brooks, LLP

(57) ABSTRACT

A substrate is prepared whose surface has a partial area exposing an insulating material containing fluorine and at least a partial area in the other area exposing a conductive material containing copper as a main composition. The surface of the substrate is exposed to hydrogen plasma to clean the surface. A first insulating film made of insulating material is formed on the cleaned surface. It is possible to form a lamination structure having a fluorine-doped interlayer insulating film hard to be peeled off.

11 Claims, 12 Drawing Sheets

LAMINATION STRUCTURE WITH COPPER WIRING AND ITS MANUFACTURE METHOD

CROSS REFERENCE TO RELATED APPLICATION

This application is based on Japanese Patent Application No. 2002-70298, filed on Mar. 14, 2002, the entire contents of which are incorporated herein by reference.

BACKGROUND OF THE INVENTION

A) Field of the Invention

The present invention relates to a lamination structure with copper wiring and its manufacture method, and more particularly to a method which is suitable for manufacturing semiconductor devices and includes a process of forming a copper wiring layer by a damascene method, and to a lamination structure having a conductive member such as copper embedded in a film made of an insulating material which contains fluorine.

B) Description of the Related Art

Demands for high performance and high speed of semiconductor devices require to shorten a delay time of an electric signal transmitting in a wiring layer. One approach to shortening a delay time is a lowered dielectric constant of an interlayer insulating film. If fluorine is doped in an interlayer insulating film, the dielectric constant can be lowered.

However, if fluorine is doped in an interlayer insulating film, peeling off is likely to occur at the interface of the interlayer insulating film when the film is laminated. JP-A-HEI-11-8235 discloses techniques of preventing peeling off by doping nitrogen into an interlayer insulating film doped with fluorine.

Even if nitrogen is doped in a fluorine-doped interlayer insulating film, local peeling off occurs in some cases.

SUMMARY OF THE INVENTION

An object of this invention is to provide a lamination structure having a fluorine-doped interlayer insulating film in which lamination structure peeling off is difficult to occur, and its manufacture method.

According to one aspect of the present invention, there is provided a method of manufacturing a lamination structure, comprising: (a) a step of exposing a surface of a substrate to hydrogen plasma to clean the surface, a partial area of the surface exposing an insulating material containing fluorine and at least a partial area in the other area of the surface exposing a conductive material containing copper as a main composition; and (b) a step of forming a first film made of an insulating material on the cleaned surface.

By exposing the surface of a conductive member to hydrogen plasma, fluorine atoms in the surface layer can be efficiently removed. Removal of fluorine atoms promotes adhesion of the first film on the surface of the conductive member and the first film can be prevented from being peeled off.

According to another aspect of the invention, there is provided a lamination structure comprising: a first insulating film made of fluorine-containing insulating material; a conductive member filled in a recess formed through the first insulating film, the conductive member containing copper as a main composition; and a second insulating film made of insulating material and disposed on surfaces of the first insulating film and the conductive member, wherein a fluorine density on an upper surface of the conductive member is 10 atom % or lower.

By setting the fluorine density on the upper surface of the conductive member to 10 atom % or lower, adhesion of the second film on the conductive member can be promoted and the second film can be prevented from being peeled off.

DESCRIPTION OF THE PREFERRED EMBODIMENT

Prior to describing an embodiment of the invention, a peeling off phenomenon will be described which occurs in a semiconductor device having a copper wiring layer embedded by a damascene method in an interlayer insulating film which contains fluorine. This peeling off phenomenon was newly found by the present inventor.

Figure 1:
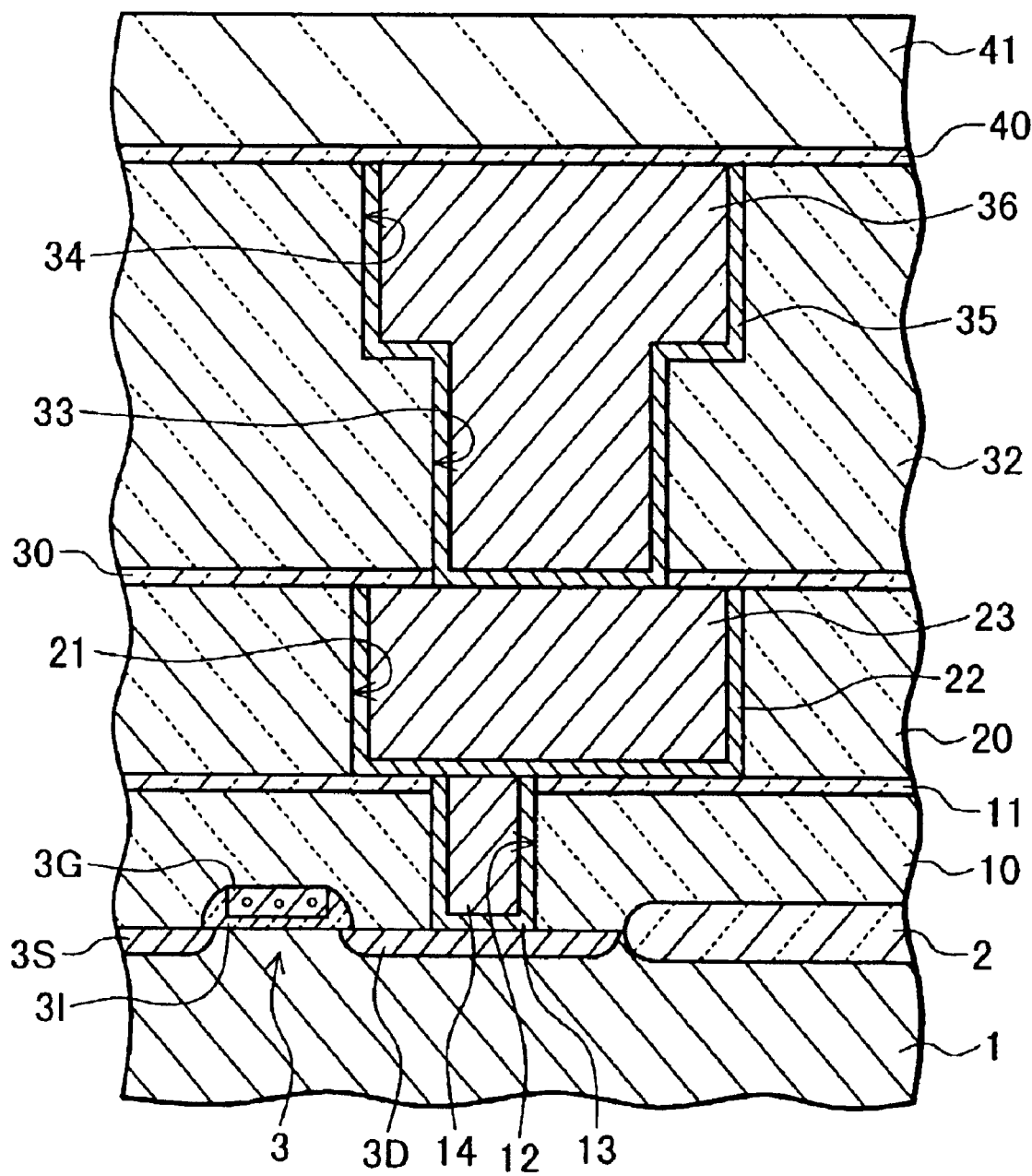
FIG. 1 is a cross sectional view of a semiconductor device according to an embodiment of the invention and prior art.

FIG. 1 is a cross sectional view of a semiconductor device having a copper wiring layer formed by a damascene method. A semiconductor device according to an embodiment of the invention has the cross sectional structure same as that shown in FIG. 1.

An active region is defined by a field oxide film 2 formed in the surface layer of a silicon substrate 1. A MOSFET 3 is formed in this active region. MOSFET 3 is constituted of a source region 3S, a drain region 3D, a gate electrode 3G, and a gate oxide film 31.

Covering MOSFET 3, an interlayer insulating film 10 of $SiO_2$ and a stopper film 11 of SiN are formed on the substrate. A contact hole 12 is formed through the interlayer insulating film 10 at the position corresponding to the drain region 3D. A barrier layer 13 of TiN covers the side wall and bottom of the contact hole 12. A plug 14 of tungsten (W) is buried in the contact hole 12.

On the stopper film 11, a first layer insulating film 20 made of fluorine-containing silicate glass and having a thickness of 400 nm is formed. A wiring groove 21 is formed through the first layer insulating film 20, reaching the stopper film 11. The wiring groove 21 crosses the area where the plug 14 is disposed. A barrier layer 22 made of TaN and having a thickness of 50 nm covers the side wall and bottom of the wiring groove 21. A first wiring layer 23 of copper is embedded in the wiring groove 21.

A barrier layer 30 of silicon nitride (SiN) is formed on the first layer insulating film 20 and first wiring layer 23. A second layer insulating film 32 made of fluorine-containing silicate glass is formed on the barrier layer 30. The barrier layer 30 prevents copper atoms in the wiring layer 23 from being diffused.

A via hole 33 reaching the first wiring layer 23 is formed through the second insulating film 32, and a wiring groove 34 reaching an intermediate depth of the second layer insulating film 32 and partially crossing the via hole 33 is formed. A barrier layer 35 made of TaN and having a thickness of 50 nm covers the inner surfaces of the wiring groove 34 and via hole 33. A second wiring layer 36 of copper is embedded in the wiring groove 34 and via hole 33. The second wiring layer 36 is electrically connected to the first wiring layer 23 via the via hole 33.

A barrier layer 40 of silicon nitride is formed on the second layer insulating film 36 and second wiring layer 34. A third layer insulating film 41 of fluorine-containing silicate glass is formed on the barrier layer 40.

The present inventor has found that peeling off is likely to occur at the interface between the first wiring layer 23 and overriding barrier layer 30 and at an interface between the second wiring layer 36 and overriding barrier layer 40. This peeling off condition was able to be detected through observation of the copper wiring layers with a metallurgical microscope.

Next, studies are made for the reason why peeling off occurs at the interface between the copper wiring layer and barrier layer. The surface of a copper wiring layer was analyzed through Auger electron spectroscopy (AES).

Figure 2A:
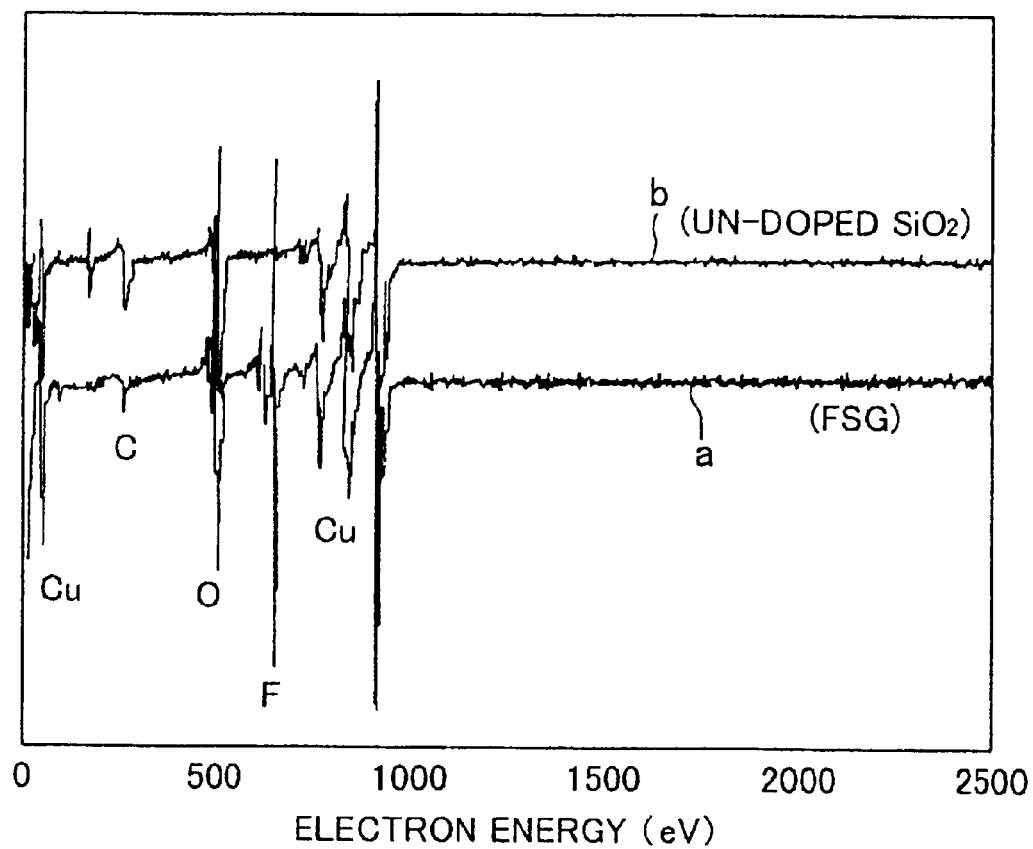
FIG. 2A is a graph showing Auger electron spectroscopy (AES) analysis results of a copper wiring layer.
Figure 2B:
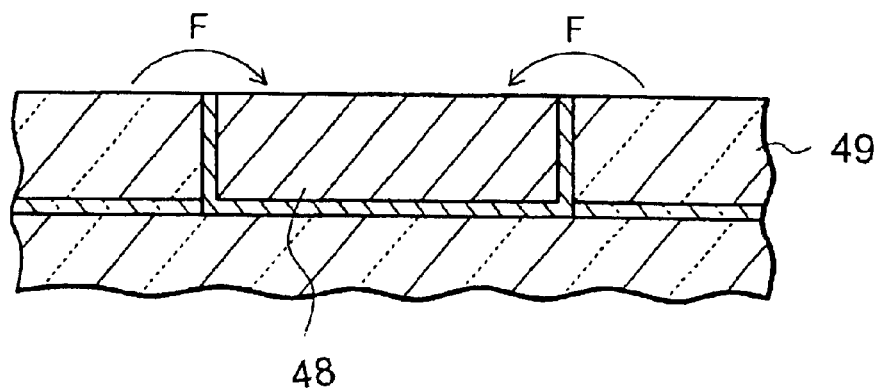
FIG. 2B is a cross sectional view of the copper wiring layer and an insulating film.

FIG. 2A shows the AES analysis results. The abscissa represents electron energy in the unit of "eV" and the ordinate represents an intensity of a detection signal. A solid line a in FIG. 2A shows the analysis results of the surface of a copper wiring layer embedded in an insulating film made of fluorine-containing silicate glass (FSG). For comparison purposes, the analysis results of the surface of a copper wiring layer embedded in an insulating film made of undoped silicon oxide are shown as indicated by a solid line b. A peak corresponding to fluorine (F) does not appear on the solid line b, whereas a large peak corresponding to fluorine appears on the solid line a It can be considered from these analysis results that peeling off results from fluorine on the surface of the copper wiring layer. As shown in FIG. 2B, it can be considered that fluorine atoms in an insulating film 49 of FSG are supplied to and left on the surface of a copper wiring layer 48 while a copper wiring layer deposited on the insulating film 49 is removed by chemical mechanical polishing (CMP). In the embodiment to be described below, peeling off can be prevented by removing fluorine atoms resident on the surface of a copper wiring layer.

A semiconductor device manufacturing method according to the embodiment will be described with reference to FIGS. 3A to 3F. FIGS. 3A to 3F show the first layer insulating film 20 and upper layers of the semiconductor device shown in FIG. 1.

Figure 3A:
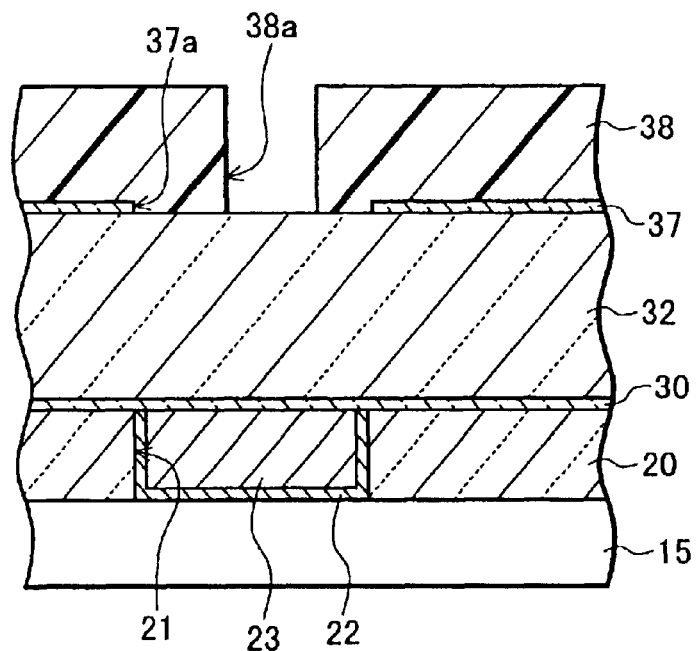
FIGS. 3A to 3F are cross sectional views of a substrate illustrating a semiconductor device manufacturing method.

Processes up to the state shown in FIG. 3A will be described. On an underlying substrate 15 having the stopper layer 11 and lower layers shown in FIG. 1, a first layer insulating film 20 is formed which is made of FSG and has a thickness of 400 nm. The first layer insulating film 20 is formed by chemical vapor deposition (CVD).

A wiring groove 21 is formed through the first layer insulating film 20. A TaN layer and a copper layer are sequentially formed on the inner surface of the wiring groove 21 and the surface of the first layer insulating film 20. The TaN layer is formed by sputtering. The copper layer is formed by depositing a thin copper seed layer by sputtering and then by performing copper plating.

Unnecessary TaN layer and copper layer deposited on the first later insulating film 20 are removed by CMP. The barrier layer 22 of TaN and the copper wiring layer 23 are left in the wiring groove 21. The surface of the copper wiring layer 23 is exposed to hydrogen plasma to clean the surface. This hydrogen plasma process will be later detailed.

A barrier layer 30 of silicon nitride is formed on the first layer insulating film 20 and copper wiring layer 23 by CVD. A second layer insulating film 32 of FSG is formed on the barrier layer 30. The second layer insulating film 32 is formed by a method similar to the method of forming the first layer insulating film 20.

A silicon nitride film 37 is formed on the surface of the second layer insulating film 32. An opening 37a corresponding to the wiring groove 34 shown in FIG. 1 is formed through the silicon nitride film 37. Next, a resist film 38 is formed covering the silicon nitride film 37 and opening 37a. An opening 38a corresponding to the via hole 33 shown in FIG. 1 is formed through the resist film 38.

Figure 3B:
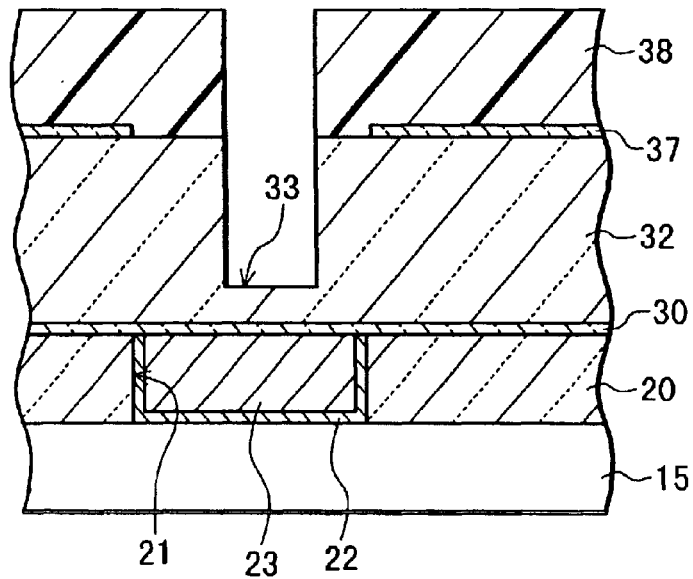

As shown in FIG. 3B, by using the resist film 38 as a mask, the second layer insulating film 32 is etched to the intermediate depth to form a via hole 33. The resist film 38 is thereafter removed. The second layer insulating film 32 can be etched by reactive ion etching (RIE).

Figure 3C:
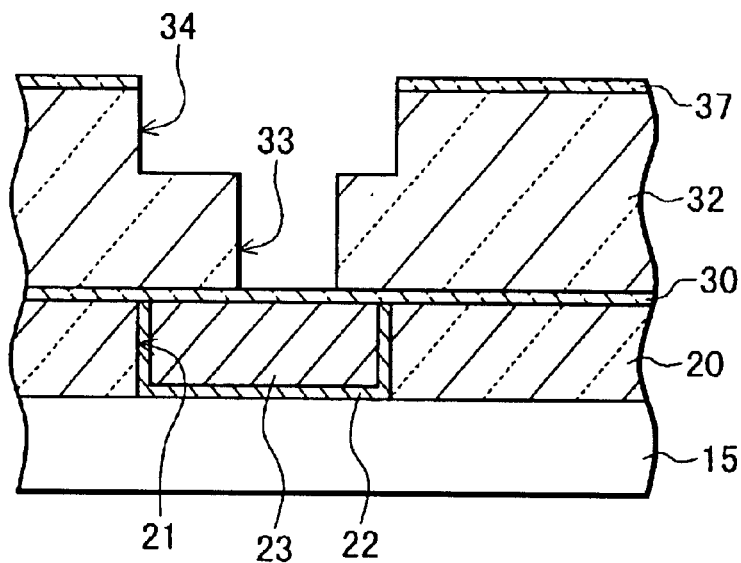

As shown in FIG. 3C, by using the silicon nitride film 37 as a mask, the second layer insulating film 32 is etched to form a wiring groove 34 reaching the intermediate depth of the second layer insulating film 32. In this case, the second layer insulating film 32 exposed on the bottom of the via hole 33 is also etched so that the via hole 33 passes through the second layer insulating film 30 and reaches the barrier layer 30.

Figure 3D:
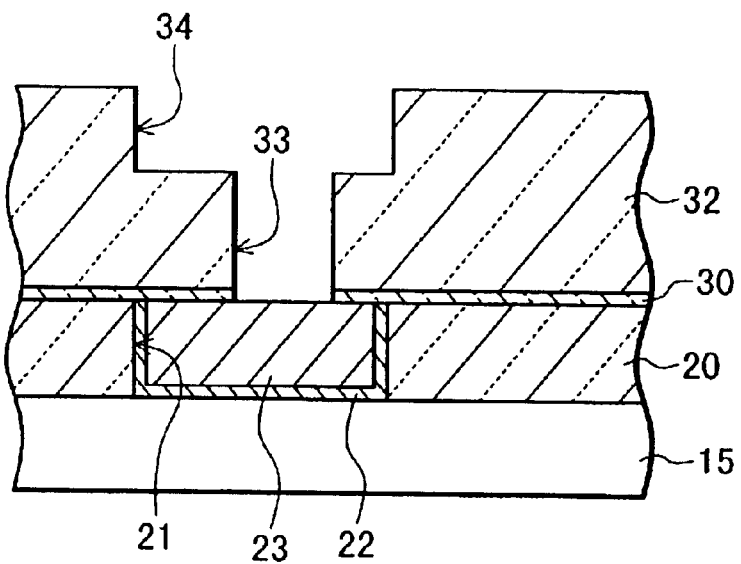

As shown in FIG. 3D, the silicon nitride film 37 left on the second layer insulating film 32 and the barrier layer 30 exposed on the bottom of the via hole 33 are etched and removed. The copper wiring layer 23 is therefore exposed on the bottom of the via hole 33.

Figure 3E:
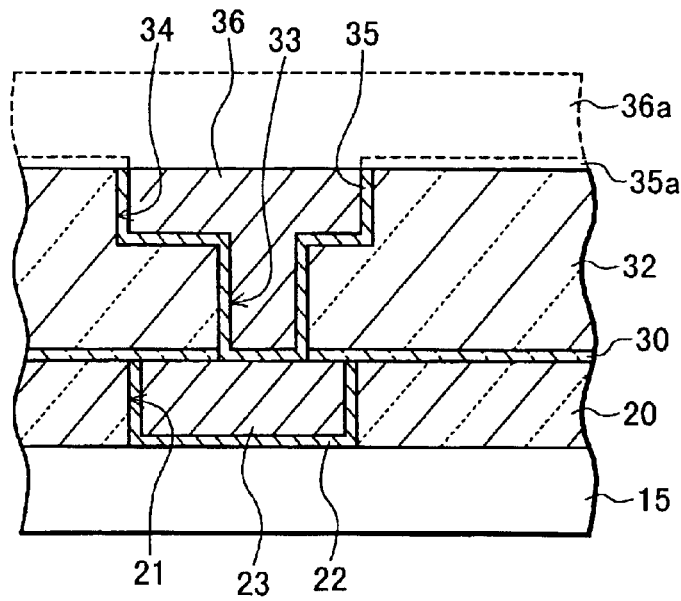

As shown in FIG. 3E, a TaN film 35a of 50 nm in thickness is formed covering the inner surfaces of the via hole 33 and wiring groove 36 and the upper surface of the second layer insulating film 32. A copper layer 36a is formed being filled in the via hole 33 and wiring groove 34. CMP is performed until the surface of the second wiring layer 32 is exposed, to thereby leave the barrier layer 35 and copper wiring layer 36 in the via hole 33 and wiring groove 34. The surface of the copper wiring layer 36 is exposed to hydrogen plasma to clean the surface.

Figure 3F:
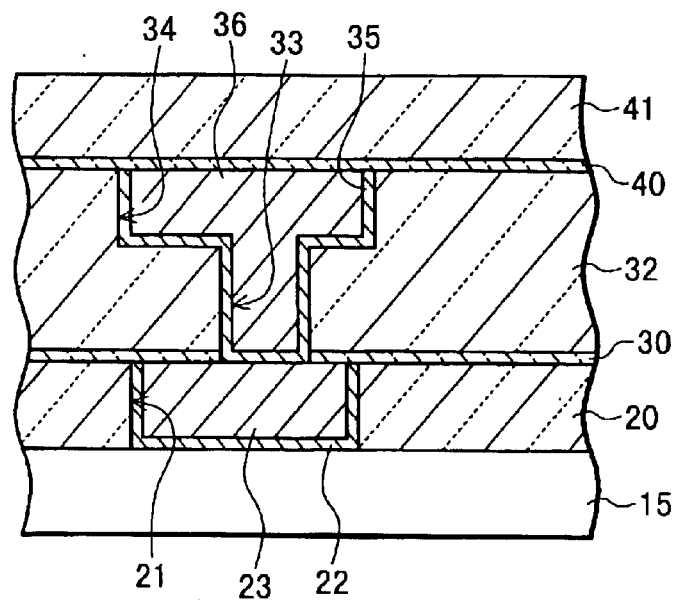

As shown in FIG. 3F, a barrier layer 40 made of silicon nitride and having a thickness of 50 nm is formed on the second layer insulating film 32 and copper wiring layer 36, and a third layer insulating film 41 of FSG is formed on the barrier layer 40.

Figure 4:
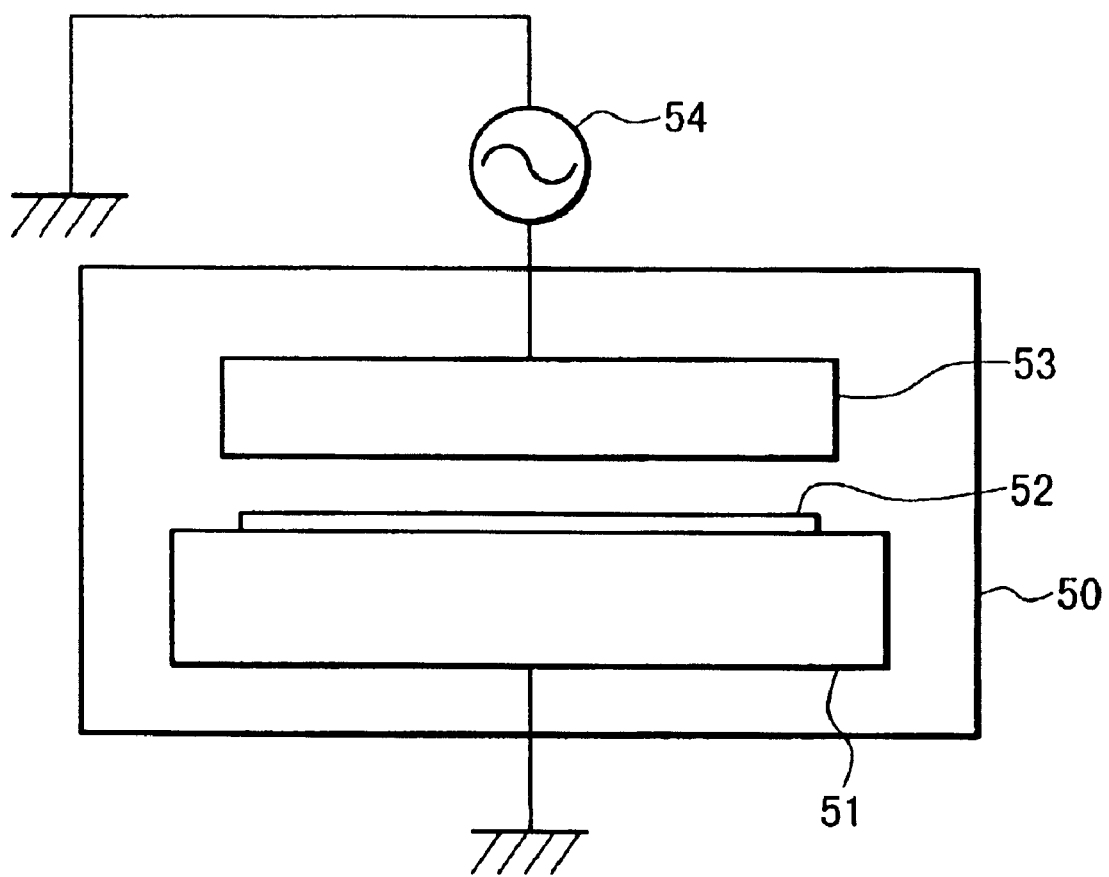
FIG. 4 is a schematic diagram showing a plasma treatment system used by the embodiment method.

FIG. 4 is a schematic diagram showing a hydrogen plasma treatment system to be used for cleaning the surfaces of the copper wiring layers 23 and 36.

A susceptor 51 is mounted in a chamber 50 capable of being evacuated. A substrate 52 with a copper wiring layer to be cleaned is placed on the susceptor 51. A shower head 53 is disposed above the susceptor 51. The susceptor 51 and shower head 53 constitute a pair of electrodes of a diode parallel plate type. The susceptor 51 is grounded and a radio frequency power source 54 applies a radio frequency voltage of 13.56 MHz to the shower head 53.

Hydrogen gas is supplied from the shower head 53 toward the susceptor 51. Hydrogen plasma is generated between the susceptor 51 and shower head 53 by capacitive coupling, and the surface of the substrate 52 is exposed to hydrogen plasma.

Figure 5A:
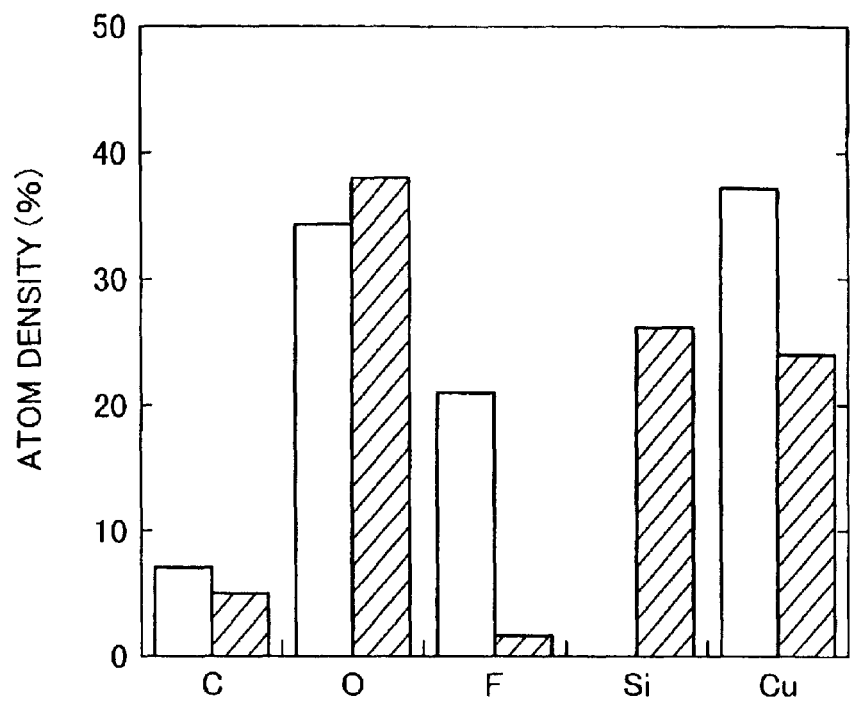
FIG. 5A is a graph showing densities of atoms on the surface of a copper wiring layer before and after hydrogen plasma treatment.

FIG. 5A is a graph showing atom densities on the surface of a copper wiring layer before and after a hydrogen plasma treatment. The atom densities were obtained by AES analysis. White bars indicate the atom densities before the plasma treatment, and hatched bars indicate the atom densities after the plasma treatment. The treatment time was set to 30 seconds.

It can be seen from this graph that fluorine atoms of about 20 atom % are contained on the surface of the copper wiring layer before the hydrogen plasma treatment and that after the hydrogen plasma treatment, the fluorine atom density lowers to about 2 atom %. The fluorine plasma treatment can remove most of fluorine atoms resident on the surface of a copper wiring layer. In the semiconductor device subjected to the hydrogen plasma treatment, peeling off did not occur at the interface between the copper wiring layer and barrier layer.

Figure 5B:
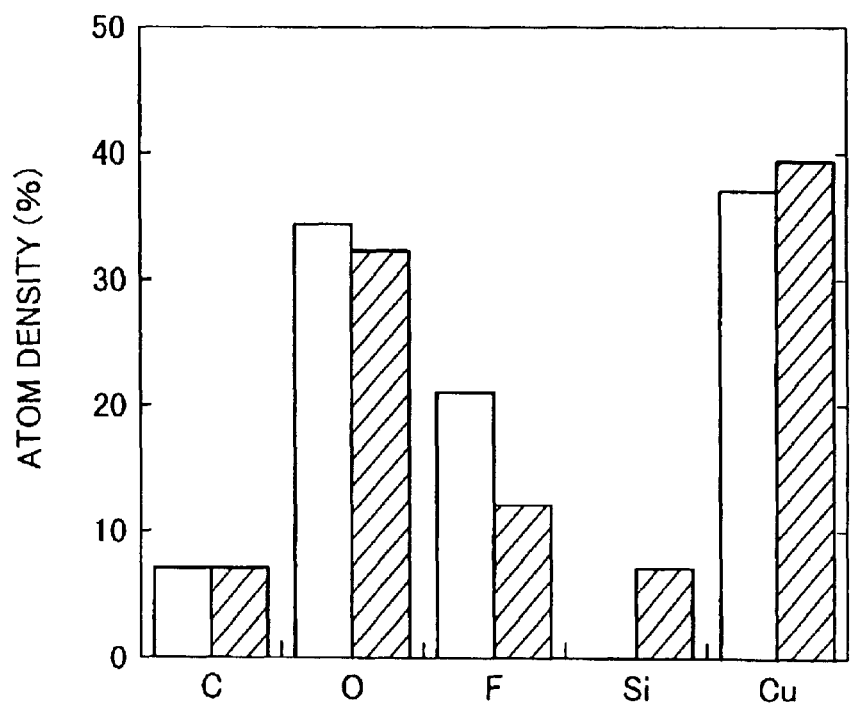
FIG. 5B is a graph showing densities of atoms on the surface of a copper wiring layer before and after ammonia plasma treatment.

For comparison purposes, atom densities on the surface of a copper wiring layer before and after an ammonia plasma treatment are shown in FIG. 5B. Although the fluorine atom density is lowered little by the ammonia plasma treatment, it is not so remarkable as the hydrogen plasma treatment. In samples subjected to the ammonia plasma treatment, peeling off was observed at the interfaces between copper wiring layers and barrier layers. Although techniques of removing copper oxide formed on the surface of a copper wiring layer by an ammonia plasma treatment are disclosed in JP-A-HEI-12-232522 and JP-A-2000-200832, sufficient fluorine removal effects were not obtained by the ammonia plasma treatment.

It is preferable to set the fluorine density on the surface of a copper wiring layer to 10 atom % or lower in order to prevent peeling off at the interface between the copper wiring layer and barrier layer.

Figure 6A:
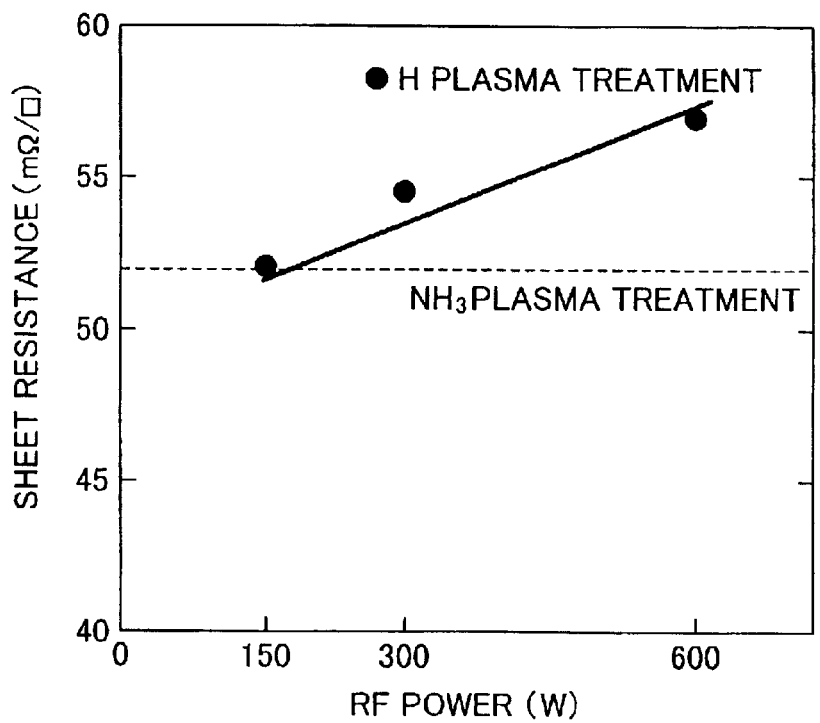
FIGS. 6A and 6B are graphs showing the relation between a radio frequency power during hydrogen plasma treatment and a sheet resistance of a copper wiring layer after the hydrogen plasma treatment.
Figure 6B:
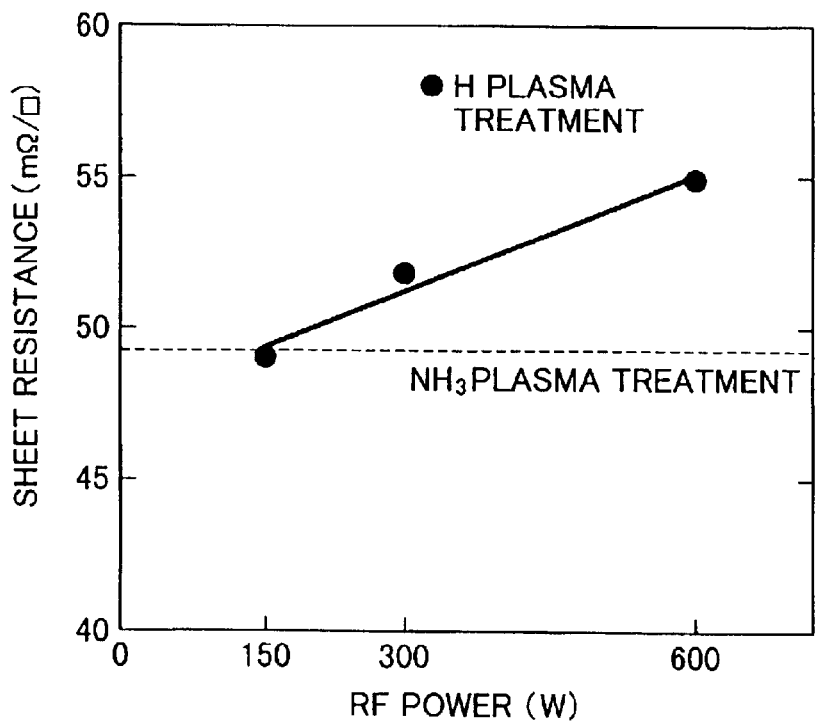

FIGS. 6A and 6B show the relation between a sheet resistance of a copper wiring layer subjected to the hydrogen plasma treatment and a radio frequency power used for the hydrogen plasma treatment. FIGS. 6A and 6B show the sheet resistances of copper wiring layers having a width of 0.54 μm and 1 μm, respectively. The abscissa represents an applied radio frequency power in the unit of "W" and the ordinate represents a sheet resistance in the unit of "mΩ/□". For comparison purposes, sheet resistances of copper wiring layers subjected to the ammonia plasma treatment are shown by broken lines.

It can be seen from these graphs that as the radio frequency power is raised, the sheet resistance becomes high. An increase in the sheet resistance may be ascribed to that the hydrogen plasma treatment etches the insulating film of FSG and emits silicon atoms which form a copper silicide film in the surface layer of the copper wiring layer.

Figure 7A:
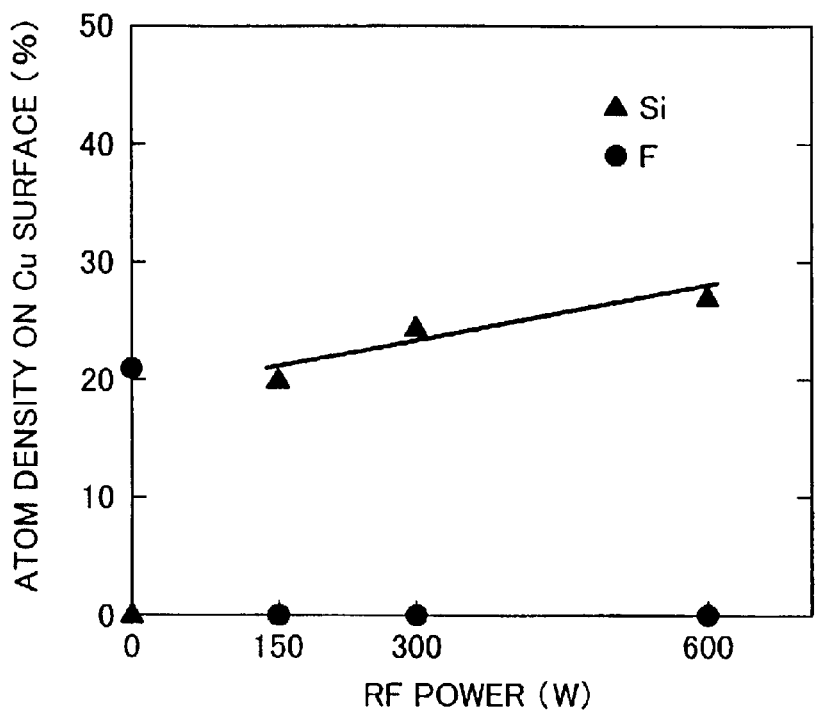
FIG. 7A is a graph showing densities of impurity atoms on the surface of a copper wiring layer after hydrogen plasma treatment.

FIG. 7A shows the relation between an atom density on the surface of a copper wiring layer subjected to the hydrogen plasma treatment and a radio frequency power applied during the hydrogen plasma treatment. The abscissa represents a radio frequency power in the unit of "W" and the ordinate represents an atom density in the unit of "atom %". In FIG. 7A, a black triangle indicates a silicon atom density, and a black circle indicates a fluorine atom density. It can be seen from this graph that as the radio frequency power is raised, the silicon atom density increases. The fluorine atom density is almost 0%.

Figure 7B:
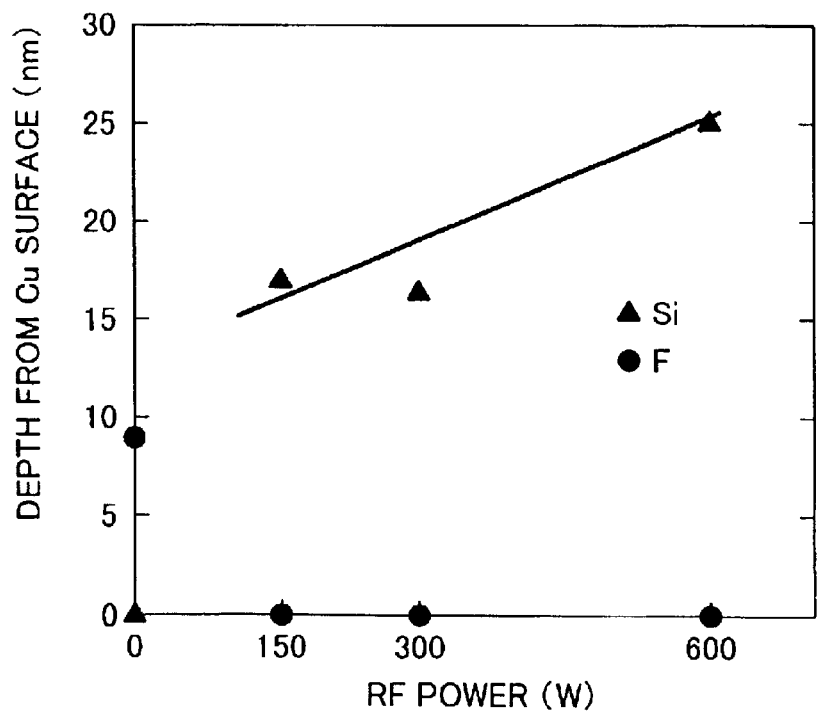
FIG. 7B is a graph showing depths of intruded impurity atoms from the surface of the copper wiring layer.

FIG. 7B shows the relation between an intrusion depth of impurity atoms into a copper wiring layer after the hydrogen plasma treatment and an applied radio frequency power. The abscissa represents a radio frequency power in the unit of "W" and the ordinate represents an intrusion depth of impurity atoms in the unit of "nm". In FIG. 7B, a black triangle indicates an intrusion depth of a silicon atom, and a black circle indicates an intrusion depth of a fluorine atom. It can be seen from this graph that as the radio frequency power is raised, the intrusion depth of silicon atoms becomes deeper. This means that a thicker copper silicide film is formed.

It can be seen from FIGS. 7A and 7B that as the applied radio frequency power during the hydrogen plasma treatment is raised, a thicker copper silicide film is formed in the surface layer of the copper wiring layer. As a thick copper silicide film is formed, the sheet resistance of a copper wiring layer becomes high.

Figure 8:
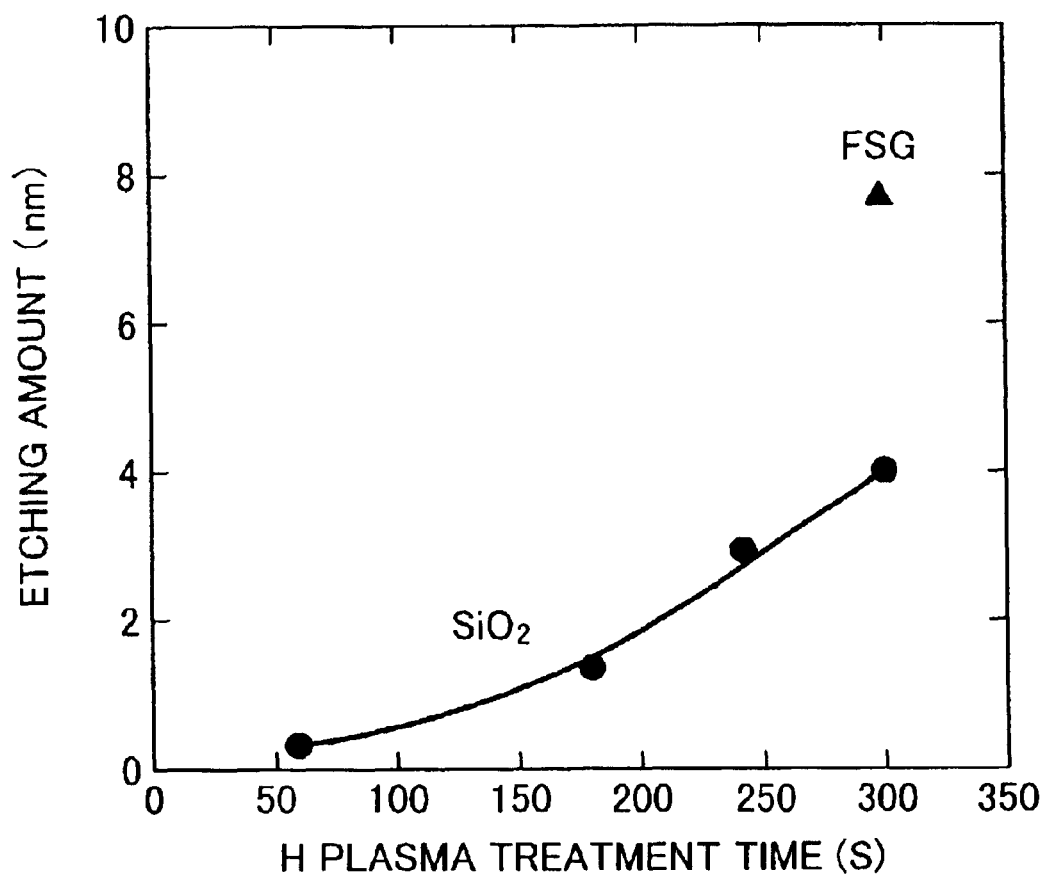
FIG. 8 is a graph showing etching amounts of a fluorine-containing silicate glass (FSG) film and a $SiO_2$ film by hydrogen plasma.

FIG. 8 shows the relation between an etching amount of an FSG film and a $SiO_2$ film by hydrogen plasma and a treatment time. The abscissa represents a hydrogen plasma treatment time in the unit of "sec" and the ordinate represents an etching amount in the unit of "nm". In FIG. 8, a black triangle indicates an etching amount of the FSG film and a black circuit indicates an etching amount of the $SiO_2$ film. It can be seen that an etching rate of FSG is faster than that of $SiO_2$.

The ammonia plasma treatment hardly etches both the $SiO_2$ film and FSG film. It can be seen therefore that hydrogen plasma has stronger chemical reaction than ammonia plasma. It can be considered that this stronger chemical reaction can remove fluorine atoms on the surface of a copper wiring layer. However, since the hydrogen plasma etches the FSG film, emitted silicon atoms silicify the surface layer of the copper wiring layer so that the sheet resistance increases.

It can be seen from FIGS. 6A and 6B that the applied radio frequency power is preferably set to 150 W or smaller in order to make the sheet resistance of a copper wiring layer subjected to the hydrogen plasma treatment approximately equal to that of a copper wiring layer subjected to the ammonia plasma treatment. By normalizing the applied power by an electrode area of the hydrogen plasma treatment system used in the embodiment, it is preferable to set the applied power per an electrode unit area to 0.2 W/cm².

In this embodiment, although the hydrogen plasma treatment is performed by using a plasma treatment system of a diode parallel plate type, other plasma treatment systems may also be used such as an inductive coupling type plasma treatment system and a remote plasma treatment system.

Figure 9A:
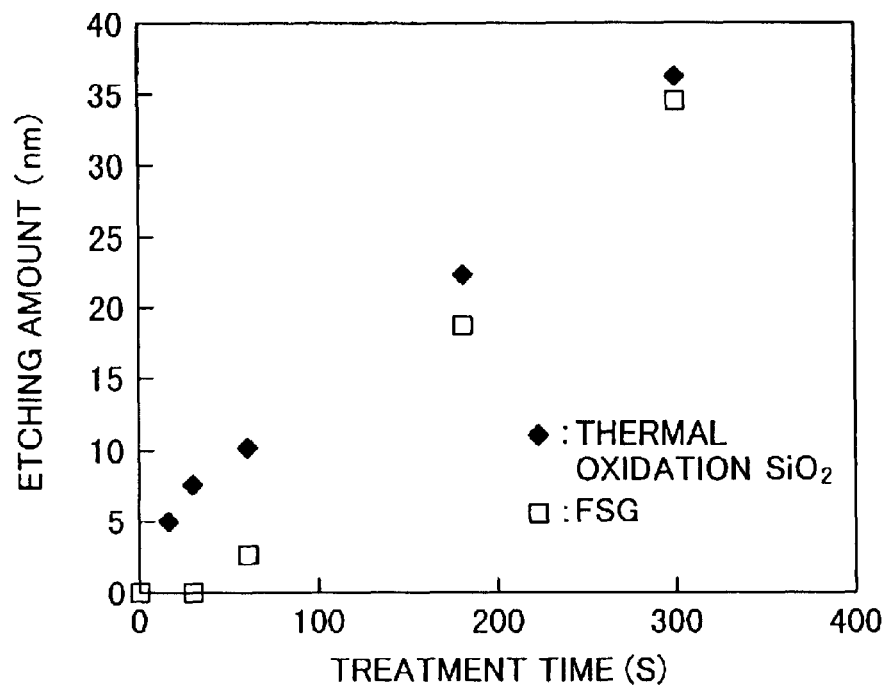
FIG. 9A is a graph showing etching amounts of an FSG film and an $SiO_2$ film by high density hydrogen plasma.

FIG. 9A shows the etching amounts of an FSG film and an $SiO_2$ film by a high density hydrogen plasma treatment using an inductive coupled type plasma treatment system. The abscissa represents a treatment time in the unit of "sec" and the ordinate represents an etching amount in the unit of "nm". In FIG. 9A, a black rhomboid indicates an etching amount of a thermal oxidation $SiO_2$ film, and a white square indicates an etching amount of an FSG film. It can be seen that a difference between both the etching amounts is small. It can be considered from this that in the process using high density hydrogen plasma generated by inductive coupling, reaction results from the effects different from those of the process using hydrogen plasma generated by capacitive coupling.

Figure 9B:
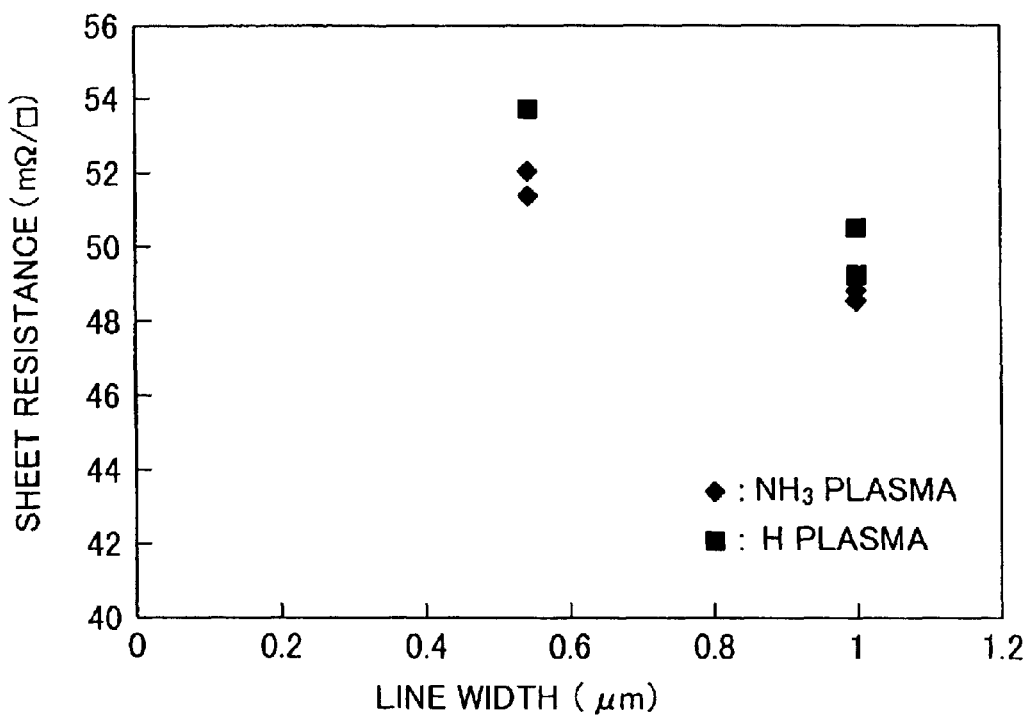
FIG. 9B is a graph showing sheet resistances of copper wiring layers after a cleaning process when high density hydrogen plasma and ammonia plasma are used.

FIG. 9B shows the sheet resistances of copper wiring layers subjected to the hydrogen plasma treatment and the ammonia plasma treatment using an inductive coupling type plasma treatment system. The abscissa represents a wiring layer or line width in the unit of "$\mu$m" and the ordinate represents a sheet resistance in the unit of "m$\Omega$/□". The sheet resistance after the hydrogen plasma treatment is higher than that after the ammonia plasma treatment, with a small difference therebetween. An increase in the sheet resistance of a copper wiring layer can be suppressed by using high density hydrogen plasma generated by inductive coupling.

Figure 10:
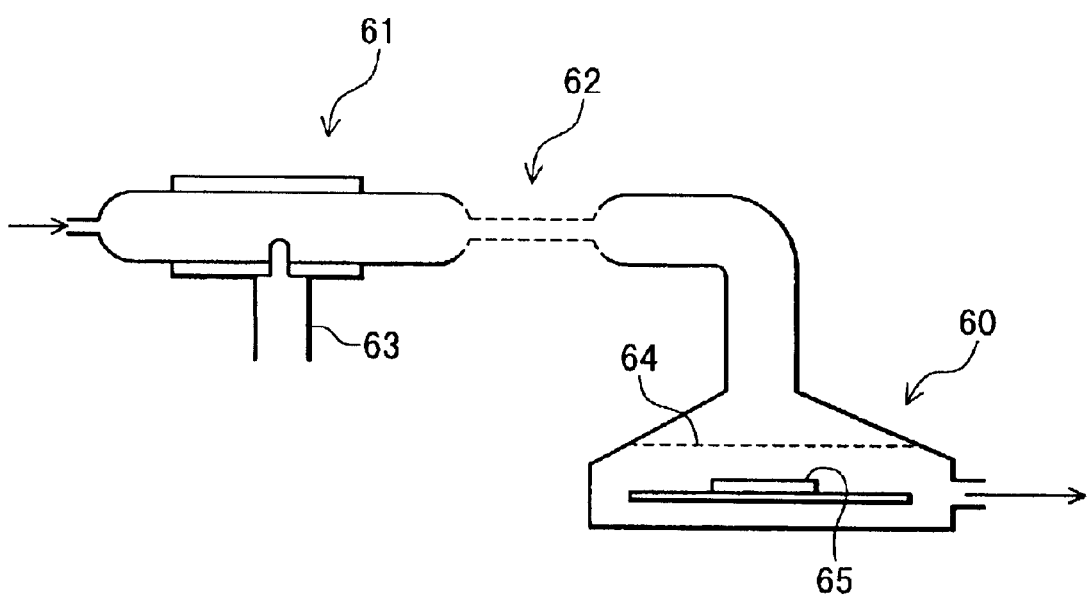
FIG. 10 is a schematic diagram showing a remote plasma treatment system.

FIG. 10 is a schematic diagram of a remote plasma treatment system. A reaction unit 60 and a plasma generating unit 61 are coupled by a transport tube 62. Hydrogen gas is supplied to the plasma generating unit 61 and micro waves are guided to the plasma generating unit 61 via a waveguide 63 to thereby generate hydrogen plasma. The generated hydrogen plasma is transported to the reaction unit 60 via the transport tube 62.

Hydrogen plasma transported to the reaction unit 60 is diffused while passing through a diffusion plate 64, and poured upon a substrate 65. By using a remote plasma treatment system, chemical reaction becomes more dominant than physical reaction. It is therefore possible to enhance the fluorine removal effects of chemical reaction.

In the above-described embodiment, copper is used as the wiring material. Similar effects can be expected for other conductive materials which contain copper as the main composition. In the above-described embodiment, although FSG is used as the material of an insulation film in which a copper wiring layer is embedded, similar effect can be expected for other insulating materials which contain fluorine. Such materials include amorphous carbon fluoride, inorganic spin-on-glass (SOG) which contains fluorine, organic SOG which contains fluorine and the like. In the above-described embodiment, silicon nitride is used as the material of the barrier layer in contact with the copper wiring layer. Other materials may also be used such as silicon carbide, phosphosilicate glass, and silicon oxide which contains carbon.

The present invention has been described in connection with the preferred embodiments. The invention is not limited only to the above embodiments. It is apparent that various modifications, improvements, combinations, and the like can be made by those skilled in the art.

I claim:

1. A method of manufacturing a lamination structure, comprising the steps of:
   (a) exposing a surface of a substrate to hydrogen plasma to clean the surface of fluorine residue, a partial area of the surface exposing an insulating material containing fluorine and at least a partial area in the other area of the surface exposing a conductive material containing copper as a main composition; and
   (b) forming a first film consisting of an insulating material on the cleaned surface of the partial area exposing the conductive material, wherein
   the step (a) is executed under a condition that a fluorine density on the surface exposing the conductive material is at most 10 atom %.

2. A method of manufacturing a lamination structure according to claim 1, before said step (a), further comprising the steps of:
   forming a second film consisting of an insulating material containing fluorine on a semiconductor surface;
   forming a recess on the second film;
   depositing a conductive film on the second film, the conductive film being filled in the recess and consisting of a conductive material containing copper as a main composition; and
   removing the conductive film to expose an upper surface of the second film, and to leave a conductive member that is a portion of the conductive film in the recess,
   wherein said step (a) exposes a surface of the conductive member left in the recess to hydrogen plasma.

3. A method of manufacturing a lamination structure according to claim 2, wherein in said step (a) hydrogen plasma is generated by using a diode parallel plate type capacitive coupling plasma treatment system under a condition that an applied power per electrode unit area is at most 0.2 W/cm$^2$.

4. A method of manufacturing a lamination structure according to claim 2, wherein in said step (a) hydrogen plasma is generated by using an inductive coupling type plasma treatment system.

5. A method of manufacturing a lamination structure according to claim 2, after said step (b) further comprising a step of forming a third film consisting of insulating material on the first film, the first film consisting of material which prevents copper diffusion more than the insulating material of the third film.

6. A method of manufacturing a lamination structure according to claim 2, wherein the second film consists of an insulating material selected from a group consisting of fluorine-containing silicate glass, amorphous carbon fluoride, fluorine-containing inorganic spin-on-glass, and fluorine-containing organic spin-on-glass.

7. A method of manufacturing a lamination structure according to claim 2, wherein the first film is made of an insulating material selected from a group consisting of silicon nitride, silicon carbide, phosphosilicate glass, and carbon-containing silicon oxide.

8. A method of manufacturing a lamination structure according to claim 1, wherein in said step (a) hydrogen plasma is generated by using a diode parallel plate type capacitive coupling plasma treatment system under a condition that an applied power per electrode unit area is at most 0.2 W/cm$^2$.

9. A method of manufacturing a lamination structure according to claim 1, wherein in said step (a) hydrogen plasma is generated by using an inductive coupling type plasma treatment system.

10. A method of manufacturing a lamination structure according to claim 1, after said step (b) further comprising a step of forming a third film consisting of insulating material on the first film, the first film consisting of material which prevents copper diffusion more than the insulating material of the third film.

11. A method of manufacturing a lamination structure according to claim 1, wherein the first film consists of an insulating material selected from a group consisting of silicon nitride, silicon carbide, phosphosilicate glass, and carbon-containing silicon oxide.

* * * * *